United States Patent
Nasir et al.

(10) Patent No.: US 7,904,497 B2
(45) Date of Patent: Mar. 8, 2011

(54) HARDWARE ARITHMETIC ENGINE FOR LAMBDA RULE COMPUTATIONS

(75) Inventors: Irfan Nasir, Lake In The Hills, IL (US); Tom Mathew, Skokie, IL (US); Magdi A. Mohamed, Schaumburg, IL (US); Jon L. Schindler, Glenview, IL (US); Weimin Xiao, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 1019 days.

(21) Appl. No.: 11/554,704

(22) Filed: Oct. 31, 2006

(65) Prior Publication Data
US 2008/0104159 A1 May 1, 2008

(51) Int. Cl.
*G06F 17/10* (2006.01)
(52) U.S. Cl. ........................................................ 708/300
(58) Field of Classification Search .................. None
See application file for complete search history.

(56) References Cited

U.S. PATENT DOCUMENTS

| | | | | |
|---|---|---|---|---|
| 7,287,235 | B1 * | 10/2007 | Hasteer et al. | 716/2 |
| 7,533,140 | B2 * | 5/2009 | Jaber | 708/322 |
| 7,656,978 | B2 * | 2/2010 | Mohamed et al. | 375/350 |
| 2003/0068097 | A1 | 4/2003 | Wilson et al. | |
| 2003/0196183 | A1 | 10/2003 | Alpert et al. | |
| 2005/0278150 | A1 * | 12/2005 | Mohamed et al. | 702/190 |
| 2006/0075012 | A1 * | 4/2006 | Minz et al. | 708/490 |
| 2008/0101512 | A1 * | 5/2008 | Mohamed et al. | 375/350 |
| 2008/0154816 | A1 * | 6/2008 | Xiao et al. | 706/15 |
| 2008/0155270 | A1 * | 6/2008 | Mohamed et al. | 713/189 |
| 2008/0247652 | A1 * | 10/2008 | Mohamed et al. | 382/224 |

OTHER PUBLICATIONS

Lee W. Young, "Corresponding Application PCT/US2007/080771—PCT International Search Report and Written Opinion," WIPO, ISA/US, Commissioner for Patents, Alexandria, VA, USA, Mar. 12, 2008, 9 pages, most relevant pp. 3, 6-8.
Simin Baharlou, "Corresponding Application PCT/US2007/080771—PCT International Preliminary Report on Patentability," The International Bureau of WIPO, Geneva, Switzerland, May 14, 2009, 7 pages, most relevant pp. 2, 5-7.

* cited by examiner

*Primary Examiner* — David H Malzahn

(57) ABSTRACT

A recursive lambda rule engine (114, 302) includes a first multiplier (204) that sequentially multiplies each of series of inputs by a nonlinearity determining parameter and supplies results to a second multiplier (214) that multiplies the output of the first multiplier (204) by a previous output of the engine (114, 302). A three input adder (220, 228) sequentially sums the output of the second multiplier (214), inputs from the series of inputs, and the previous output of the engine (114, 302). A shift register (244) is used to feedback the output of the engine (114, 302) to the three input adder (220, 228) and second multiplier (214). A MUX (234) is used to route an initial value through the shift register (244) for the first cycle of operation.

9 Claims, 5 Drawing Sheets ary engine for lambda rule computations

FIELD OF THE INVENTION

The present invention relates generally to adaptive nonlinear digital signal processing.

BACKGROUND

Filters are a basic and important component of a variety of electrical systems. Among the broad categories of electrical systems that use filters are communication systems such as optical, electrical and wireless communication systems and sensor systems, such as medical diagnostic systems, fire detection systems, object tracking systems, wireless controllers, smart cameras, and smart phones. Other generic time series data processing systems include financial predictors.

Filters are, broadly speaking, used to facilitate the extraction of information from captured signals or any input data stream. Conventional filters perform this task by suppressing noise, thereby increasing the Signal to Noise Ratio (SNR). Conventional filters are designed to pass certain frequencies and block other frequencies. Frequency bands that include desired information are passed and out of band noise energy is blocked. Traditional filters used linear analog circuits. Since the advent of digital electronics Digital Signal Processing (DSP) filters have come into widespread use. Conventional DSP filters are also designed to pass certain frequencies and reject other frequencies.

Q-filters are a new class of adaptive nonlinear digital filters that are used in place of one or more conventional DSP filters. Q-filters are described in co-pending patent application Ser. No. 10/854,836 by M. Mohamed et al. which is assigned to the assignee of the invention described herein. Q-filters operation and kernel parameter estimation are described in Magdi Mohamed et al., *Application of Q-Measures Techniques to Adaptive Nonlinear Digital Filtering*, 2006 IEEE INTERNATIONAL CONGRESS ON COMPUTATIONAL INTELLIGENCE, 2006 IEEE INTERNATIONAL CONFERENCE ON FUZZY SYSTEMS, in Vancouver, BC, Canada, Jul. 16-21, 2006. A Q-filter is defined as a Choquet integral of the input signal with respect to a Q-measure over a window of the input signal values. Q-measures are described in M. Mohamed et al., *Q-Measures: An Efficient Extension of the Sugeno Lambda-Measure*, IEEE TRANSACTIONS ON FUZZY SYSTEMS, Vol. 11, No. 3, June 2003.

Co-pending patent application Ser. No. 11/554,689 entitled "Fast Q-Filter" by M. Mohamed et al. (which is assigned to the assignee of the invention described herein) describes a fast Q-filter method. The method involves explicitly calculating the values of a set function. Although, the method can be implemented in software, in the interest of increasing speed and reducing power consumption, which is particularly important in the case of handheld devices, it would be desirable to be able to implement, at least part of, the fast Q-filter in hardware.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
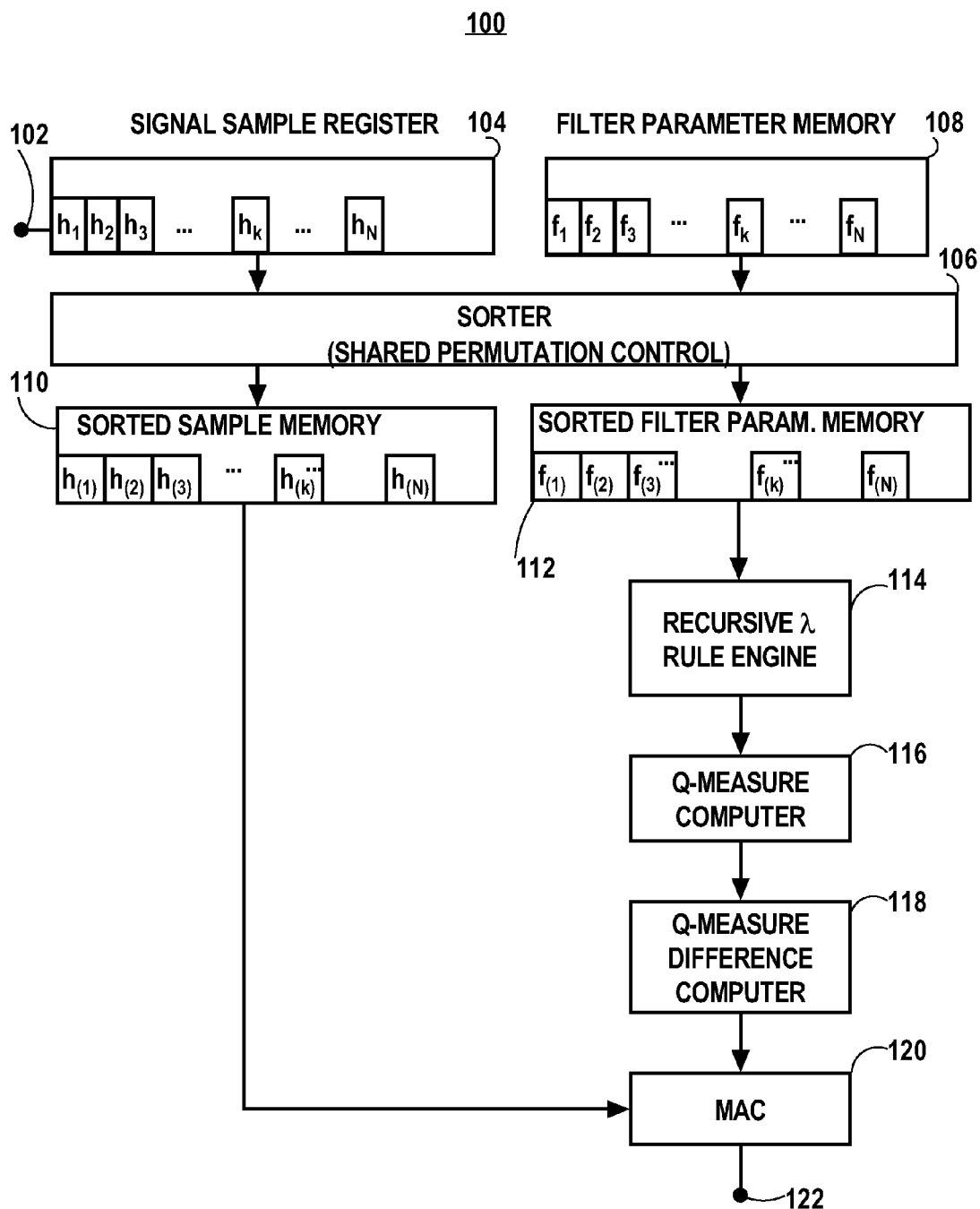
FIG. 1 is a high level hardware block diagram of a fast Q-filter in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations apparatus components related to nonlinear signal processing. Accordingly, the apparatus components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some of the functions of nonlinear signal processing described herein. The non-processor circuits may include, but are not limited to, a radio receiver, a radio transmitter, signal drivers, clock circuits, power source circuits, and user input devices. As such, these functions may be interpreted as steps of a method to perform nonlinear signal processing. Alternatively, some functions could be implemented by a state machine that has no stored program instructions, or in one or more Application Specific Integrated Circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

FIG. 1 is a high level hardware block diagram of a fast Q-filter 100 in accordance with some embodiments of the invention. Digitized signal samples are received at an input 102 of a signal sample register 104. The signal samples can come from an analog-to-digital converter (not shown) or from a signal line or from a memory, for example. The size of the signal sample register 104 may be varied by trial and error in order to determine a size that works well for a particular filtering application. Trial and error tests can be conducted using a software implementation of the fast Q-filter.

The signal sample register 104 is coupled to a sorter 106. The sorter 106 can work by permuting signal samples in memory, or by permuting entries in a permutation array, i.e., via indirect sorting. A filter parameter memory 108 is also coupled to the sorter 106. A set of filter parameters that are stored in the filter parameter memory 108 are also referred to as densities and are denoted fi. As will be described below the densities are used in nonlinear signal filtering. The sorter 106 sorts the signals in the signal sample register 104 in order to obtain a monotonic ordering of the signal samples. The actual signal samples, or the permutation array (if used) can be sorted. The necessary permutations required to obtain the monotonic ordering of the signal samples are also applied to the filter parameters in the filter parameter memory 108. Thus, for example, if sorting the signal samples would require an exchange of the signal samples in the second and fourth positions of the signal sample register 104, then the second and fourth filter parameters would also be exchanged (either actually, or virtually, through the use of the permutation array or other mechanism).

As shown in FIG. 1, the sorter 106 is coupled to a sorted sample memory 110 and a sorted filter parameter memory 112. (In some embodiments in which a permutation array is used it is unnecessary to provide the separate sorted sample memory 110 and the sorted filter parameter memory 112.) The sorted filter parameter memory 112 is coupled to a recursive lambda rule engine 114. In such cases a permutation array register or memory location may be used.

Figure 2:
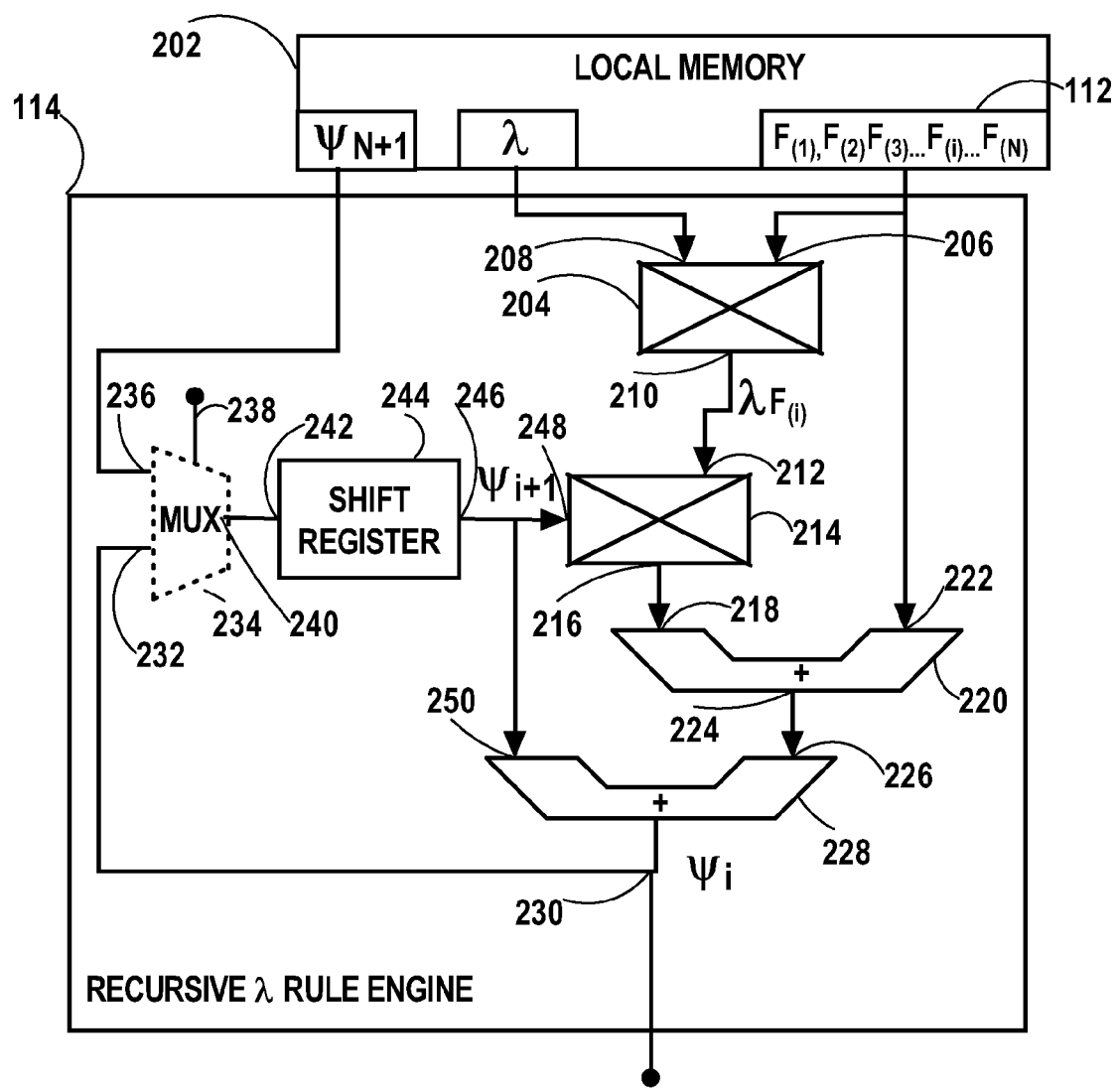
FIG. 2 is a hardware block diagram of a recursive lambda rule engine that is used in the fast Q-filter shown in FIG. 1.

FIG. 2 is a hardware block diagram of the recursive lambda rule engine 114 that is used in the fast Q-filter shown in FIG. 1. In FIG. 2 a local memory 202 is shown. The local memory 202 includes the sorted filter parameter memory 112. The local memory 202 also includes a nonlinearity determining parameter, denoted $\lambda$. The local memory 202 is coupled to a first multiplier 204 of the recursive lambda rule engine 114. The filter parameters fi are supplied sequentially (in the order dictated by the monotonic ordering of the signal samples) to a first input 206 of the multiplier 204. The first multiplier receives the nonlinearity determining parameter $\lambda$ at a second input 208. The first multiplier 204 outputs a series of products $\lambda f_{(i)}$ at an output 210. Note that the index i ranges from one up to the size of the signal sample register N which is also the number of filter parameters.

The output 210 of the first multiplier 204 is coupled to a first input 212 of a second multiplier 214. The first multiplier 204 in combination with the second multiplier 214 form a three input multiplier. One skilled in the art will appreciate that signals input to the first multiplier 204 and the second multiplier 214 may be permuted among the inputs of the first multiplier 204 and second multiplier 214 without changing the functioning of the engine 114. An output 216 of the second multiplier 214 is coupled to a first input 218 of a first adder 220. A second input 222 of the first adder 220 sequentially receives the sorted filter parameters directly from the local memory 202. An output 224 of the first adder 220 is coupled to a first input 226 of a second adder 228. Accordingly, the first adder 220 and the second adder 228 form a three input adder.

An output 230 of the second adder 228 is coupled to a first input 232 of a multiplexer 234. A second input 236 of the multiplexer 234 is coupled to the local memory 202. An initial set function value (e.g., denoted $\psi_{N+1}$) is stored in the local memory 202 and received at the second input 236. A control input 238 of the multiplexer 234 determines which of the first input 232 and second input 236 is coupled to an output 240 of the multiplexer 234. Initially the second input 236 at which the initial set function value is received is coupled to the output 240. For subsequent cycles of operation of the recursive lambda rule engine 114 the first input 232 of the multiplexer 234 which is coupled to the output 230 of the second adder 228, is coupled to the output of the multiplexer 234 so that the engine 114 operates in a recursive manner.

The output 240 of the multiplexer 234 is coupled to an input 242 of a shift register 244. An output 246 of the shift register 244 is coupled to a second input 248 of the second multiplier 214 and to a second input 250 of the second adder 228.

By way of example, the recursive lambda rule engine 114 can generate values of the following recursive set function that is defined over the set of filter parameters $f_i$.

$$\psi_i = f_{(i)} + \psi_{i+1} + \lambda f_{(i)} \psi_{i+1} \qquad \text{EQU. 1}$$

where,
$\psi_{n+1} = 0$ and
$f_{(i)}$ is an $i^{th}$ filter parameter in a permutation of the filter parameters according to the same permutation required to sort the signal samples.

During each cycle of operation, the output of the first multiplier 204 is $\lambda f_{(i)}$, the output of the second multiplier 214 is $\lambda f_{(i)} \psi_{i+1}$ (the third term in equation 1), the output of the first adder 220 is $f_{(i)} + \lambda f_{(i)} \psi_{i+1}$, and the output of the second adder 228 is $\psi_{i+1} + f_{(i)} + \lambda f_{(i)} \psi_{i+1}$. Note that the recursion relation specified by equation 1 starts with $\psi_{n+1}$ and works backwards.

The set function values generated by the recursive lambda rule engine 114 are passed to a Q-measure computer 116 (see FIG. 1). The Q-measure computer 116 generates a new set of set function values by dividing each of the set function values output by the recursive lambda rule engine 114 by the largest set function value, which in the case of the set given by equation 1 is $\psi_1$. (In other words, the set function values are normalized.) The set function values computed by the Q-measure computer is called a Q-measure. The Q-measure set function values are bounded within the interval (0,1). The Q-measures are given by the following equation.

$$q_i = \psi_i / \psi_1 \qquad \text{EQU. 2}$$

Note that $\psi_1$ is guaranteed to be the Max_over_i ($\psi_i$) and Sum_over_i (fi) is constrained to be greater than ZERO.

The Q-measures computed by the Q-measure computer 116 are passed to a Q-measure difference computer 118. The Q-measure difference computer calculates the differences between successive pairs of Q-measures. The differences are expressed by the following equation.

$$\Delta q_i = q_i - q_{i+1} \qquad \text{EQU. 3}$$

Note that the sum of the differences is equal to one. The differences are passed to a multiply-and-accumulate block (MAC) 120. The MAC computes the dot product of the differences output by the Q-measure difference computer 118 and the sorted signal samples. Because the processing performed in the Q-measure computer 116 and the Q-measure difference computer 118 leads to a set of differences, the sum of which is equal to one, nonlinear signal processing is accomplished without the need to rescale the output of the fast Q-filter. Output of the fast Q-filter 100 is provided at an output 122 of the MAC 120.

Despite the use of the MAC 120 at the final stage of the fast Q-filter 100, the fast Q-filter is fundamentally different in nature from the common Finite Impulse Response (FIR) filter which also uses a MAC. One important difference is that signal samples are associated with filter coefficients (e.g., the differences given by equation 3) based on amplitude sorting not based on position in a sample window. Another important difference is that the filter coefficients change depending on the permutations required to sort the signal samples because the order in which the filter parameters are used in equation 1, for example changes. Yet, another important difference is that rather than being based on frequency analysis and transform methods the filter coefficients are based on a set function over a set of filter parameters.

In certain embodiments the initial set function value is zero. In such embodiments it is not necessary to use the multiplexer 234, if the shift register 244 is initialized to zero.

Figure 3:
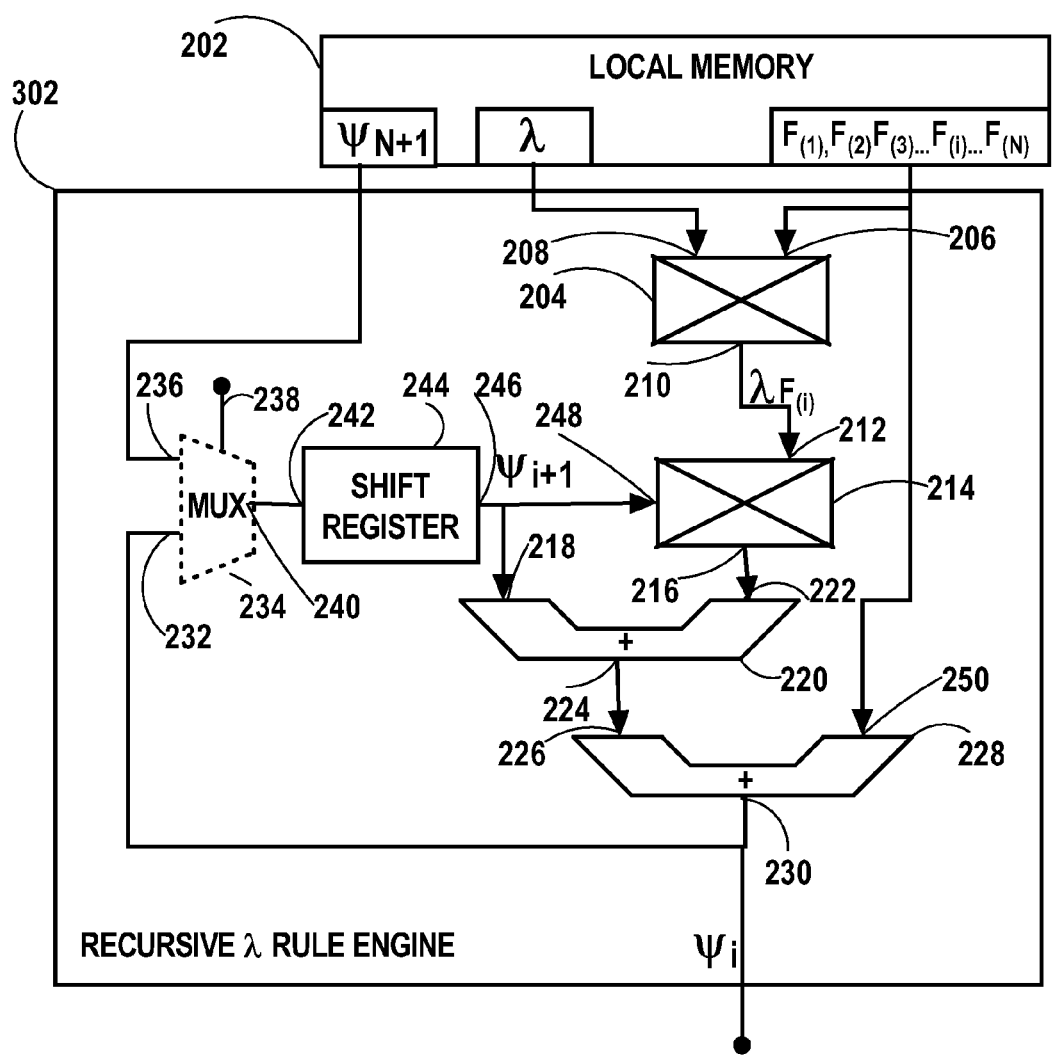
FIG. 3 is a hardware block diagram of a recursive lambda rule engine according to an alternative embodiment of the invention.

FIG. 3 is a hardware block diagram of a recursive lambda rule engine 302 according to an alternative embodiment of the invention. The alternative recursive lambda rule engine 302 differs in how the first adder 220 and the second adder 228 are connected to other components. In particular the output 246 of the shift register 244 is coupled to the first input 218 of the first adder 220, and the output 216 of the second multiplier 214 is coupled to the second input 222 of the first adder 220. Moreover, the second input 250 of the second adder 228 receives the filter parameters $f_{(i)}$ directly from the sorted filter parameter memory 112. In this alternative the first adder 220 and the second adder 228 also make up a three input adder. In this embodiment, during each cycle of operation the output of the first adder 220 is $\psi_{i+1} + \lambda f_{(i)} \psi_{i+1}$. The alternative recursive lambda rule engine 302 can be used in place of the recursive lambda rule engine 302.

Figure 4:
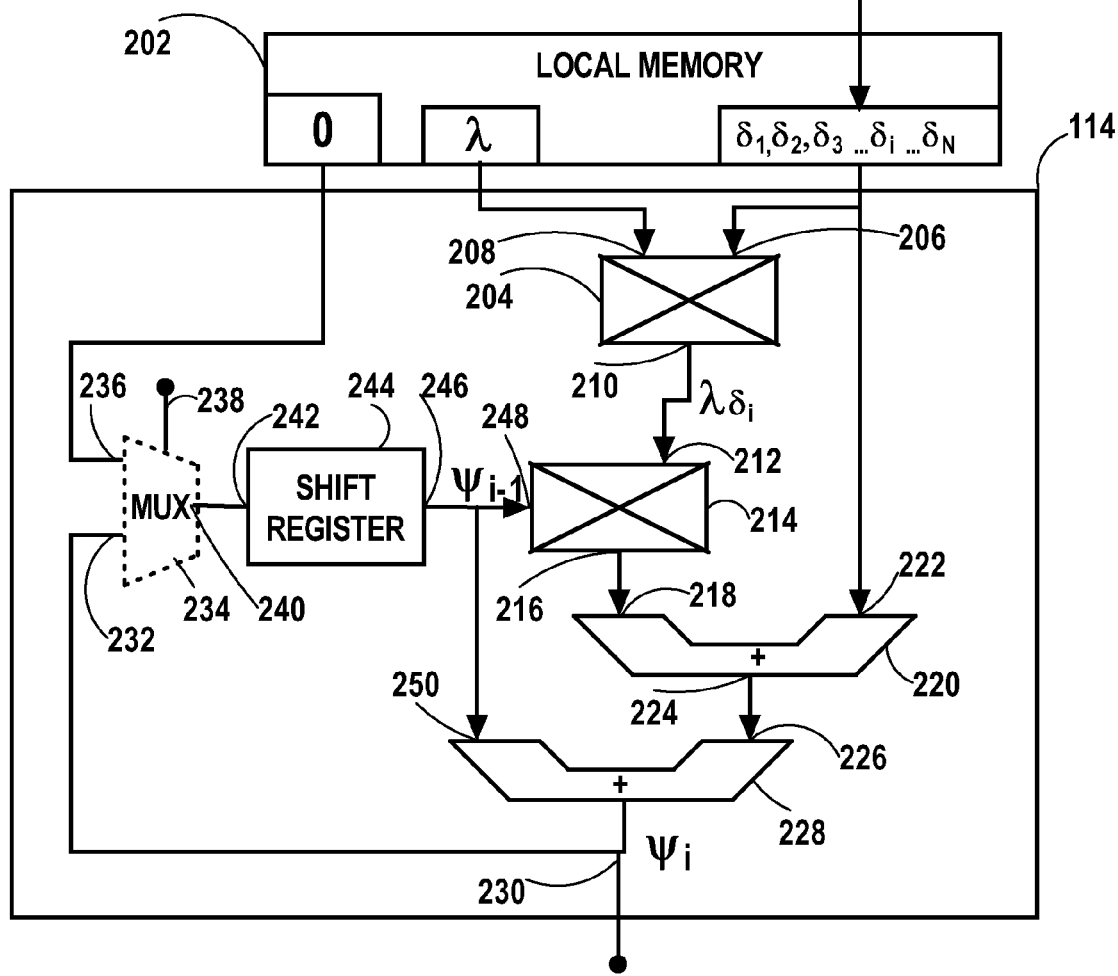
FIG. 4 is a hardware block diagram of a Q-metric computer that uses the recursive lambda rule engine.

FIG. 4 is a hardware block diagram of a Q-metric computer 400 that uses the recursive lambda rule engine 114. The Q-metric computer 400 computes a nonlinear distance metric. The Q-metric computer 400 is useful in many applications including a variety of pattern recognition systems in which it is used in place of programs or hardware that are based on conventional metrics such as Euclidean metrics. In pattern recognition applications the Q-metric is used to define feature vector subspaces corresponding to particular classifications of subjects and/or to assign feature vectors derived from measurements to one of multiple feature vector subspaces which corresponds to one classification. The Q-metric function can be represented by the following formula:

$$d_{\lambda,n}(x,y) = \left[ \prod_{i=1}^{n} (1 + \lambda w_i |x_i - y_i|) - 1 \right] / \lambda, \quad \text{EQU. 4}$$

$$\lambda >= -1, \lambda \neq 0$$

$$d_{\lambda,n}(x,y) = \sum_{i=1}^{n} w_i |x_i - y_i|, \quad \lambda = 0.$$

where, $\lambda >= -1$ is a configuration parameter;
$x_i$ is an $i^{th}$ component of a first n-dimensional feature vector that is denoted x $y_i$ is an $i^{th}$ component of a second n-dimensional feature vector that is denoted y;
$w_i$ is a weight for the $i^{th}$ dimension such that the sum of the weights $w_i$ is not equal to ZERO.
$d_{\lambda,n}(x,y)$ is a distance between the first feature vector and the second feature vector, computed by the Q-metric function.

Note that the components $x_i$, $y_i$ of the feature vectors x, y are normalized so that they are in the range from zero to one. The weights $w_i$ are also restricted to being between zero and one.

Another way to compute the Q-metric is by the following recursion relation.

$$\Psi_i = w_i |x_i - y_i| + \Psi_{i-1} + \lambda w_i |x_i - y_i| \Psi_{i-1} \quad \text{EQU. 5}$$

starting with an empty set function value:
$\Psi_0 = 0$
The Q-metric is then given by:
$d_{\lambda,n}(x,y) = \Psi_n$ Various uses of the Q-metric including for pattern recognition are covered in co-pending patent application Ser. No. 11/554,643 entitled PATTERN RECOGNITION WITH Q-METRICS, filed concurrently herewith. The recursive lambda rule engine 114 is suitably used to determine Q-metric distances by applying the recursion relation given by equation five. Referring to FIG. 4, a first vector memory 401 and a second vector memory 402 are coupled to a first input 403 and a second input 404 of a subtractor 405. The Q-metric computer 400 computes a Q-metric distance between the first vector and the second vector. In some cases one of the vectors is a stored prototype vector for a pattern classification and the other is a feature vector representing a measured subject. In other cases both vectors are prototype vectors or feature vectors representing subjects. An output 406 of the subtractor 405 is coupled to an input 407 of a magnitude computer 408. The subtractor 405 computes a vector difference between the first vector 401 and the second vector 402 and outputs a set of component differences. The magnitude computer 408 computes the absolute value of each component of the difference. An output 409 of the magnitude computer 408 is coupled to a first input 410 of an optional third multiplier 411. An optional dimension weight memory 412 is coupled to a second input 413 of the optional third multiplier 411. The multiplier 411 weights (multiplies) each absolute value vector component difference by a weight stored in the dimension weight memory 412.

The optionally weighted, absolute values of the vector component differences, denoted $\delta_i$ are stored in the local memory 202. The $\delta_i$'s are operated upon by the engine 114 in the same way that the filter parameters $f_{(i)}$ are operated upon in the fast Q-filter 100. One minor formal difference that relates to the order in which the differences $\delta_i$ are sequence is that the recursion relation given by equation 5 starts with a zeroth $\psi$ and computes values of $\psi$ have successively higher indexes, whereas the in the fast Q-filter application the engine 114 is started at $\psi_{N+1}$ and works backwards.

Figure 5:
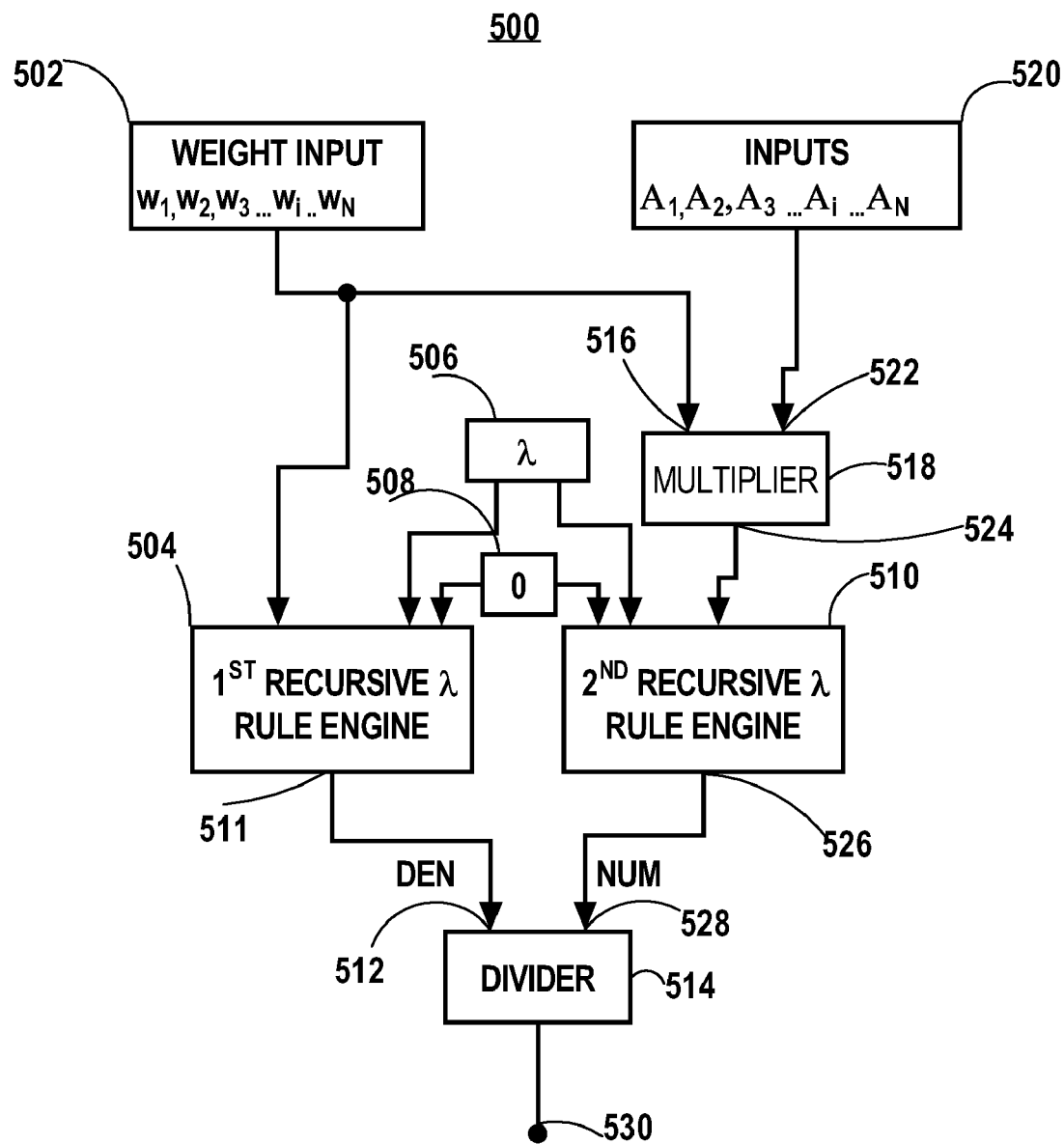
FIG. 5 is a hardware block diagram of a Q-aggregator that uses two of the recursive lambda rule engines.

FIG. 5 is a hardware block diagram of a Q-aggregator 500 that uses the recursive lambda rule engine 114. The Q-aggregator 500 is useful for combining multiple information bearing signals to form an aggregate signal. The Q-aggregator 500 can, for example be used to combine signals from sensors that measure physical parameters such as temperature, pressure, light intensity. The Q-aggregator 500 can also be used to combine signal output from separate information processing systems, for example. The input-output function of the Q-aggregator 500 can be described by the following formula:

$$h_\lambda(a_1, \ldots, a_n) = \frac{\prod_{i=1}^{n}(1+\lambda w_i a_i) - 1}{\prod_{i=1}^{n}(1+w_i \lambda) - 1}, \quad \lambda \geq -1, \lambda \neq 0,$$ EQU. 6

$$h_\lambda(a_1, \ldots, a_n) = \frac{\sum_{i=1}^{n} w_i a_i}{\sum_{i=1}^{n} w_i}, \quad \lambda = 0.$$

where, $\lambda \geq -1$ is the control parameter that is used to configure the aggregator 500;

$a_i$ is a $i^{th}$ input to the aggregator 500, which is in the normalized range zero to one;

$w_i$ is a $i^{th}$ input weight, which is in the range zero to one. Note also that the sum of the weights $w_i$ is not equal to zero;

n is a number of inputs; and $h_\lambda(a_1, \ldots, a_n)$ is the output of the aggregator 500 which is also in the normalized range zero to one.

However, by evaluating the recursion relation:

$$\Psi_i = w_i a_i + \Psi_{i-1} + \lambda w_i a_i \Psi_{i-1}$$ EQU. 7 starting with an initial function value:
$\Psi_0 = 0$
until $\psi_N$ is obtained and multiplying $\psi_N$ by $\lambda$ the numerator of equation six for the cases $\lambda \geq -1$, $\lambda \neq 0$ is obtained. Furthermore by evaluating the recursion relation:

$$\Psi_i = w_i + \Psi_{i-1} + \lambda w_i \Psi_{i-1}$$ EQU. 8 starting with an initial function value:
$\Psi_0 = 0$
until $\psi_N$ is obtained and multiplying $\psi_N$ by $\lambda$ the denominator of equation six for the cases $\lambda \geq -1$, $\lambda \neq 0$ is obtained. Note that for some applications a non-weighted aggregator in which all the weights are considered equal to one may be used.

Referring to FIG. 5, a sequence of input weights $w_i$ are input through a weight input 502 that is coupled to a first recursive lambda rule engine 504. The control parameter $\lambda$ is input via a control parameter input 506 that is also coupled to the first recursive lambda rule engine 504. Also, an initial value of zero is input via a zero input 508. The MUX 234 of the first recursive lambda rule engine 504 and of a second recursive lambda rule engine 510 are initially set to pass the zero from the zero input 508. The first recursive lambda rule engine 504 is operated until the value $\psi_N$ (given by equation 8) is computed. The value of $\psi_N$ is coupled from an output 511 of the first recursive lambda rule engine 504 to a denominator input 512 of a divider 514.

The sequence of input weights $w_i$ are also coupled to first input 516 of a multiplier 518. An input 520 of the aggregator for receiving the values $a_i$ to be aggregated is coupled to a second input 522 of the multiplier 518. The multiplier 518 outputs a sequence of products $w_i a_i$. An output 524 of the multiplier 518 is coupled to the second recursive lambda rule engine 510. (Note that either of the recursive lambda rule engines 114, 302 shown in FIGS. 2, 3 can be used in the aggregator 500.) The second recursive lambda rule engine 510 is operated until the value $\psi_N$ (given by equation 7) is computed. The value of $\psi_N$ computed by the second recursive lambda rule engine 510 is coupled from an output 526 of the second recursive lambda rule engine 510 to a numerator input 528 of the divider 514. An output 530 of the divider 514 outputs the output $h_\lambda(a_1, \ldots, a_n)$ of the aggregator 500.

In the case $\lambda=0$ the first recursive lambda rule engine 504 produces the denominator of equation six for the case $\lambda=0$, i.e., the sum of the weights $w_i$, and the second recursive lambda rule engine 510 produces the numerator of equation six for the case $\lambda=0$, i.e., the weighted sum of the inputs $a_i$. Thus the Q-aggregator 500 can handle the full range of values of the control parameter $\lambda \geq -1$.

The Q-aggregator is covered in co-pending patent application Ser. No. 11/554,674 entitled "Method And Apparatus For Nonlinear Signal And Data Aggregation" filed concurrently herewith.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A recursive lambda rule engine comprising:
    a first input for receiving a nonlinearity determining parameter;
    a second input for receiving a set of inputs;
    a three input multiplier coupled comprising:
        a first input, coupled to said first input of the recursive lambda rule engine, for receiving said nonlinearity determining parameter;
        a second, coupled to said second input of the recursive lambda rule engine, for sequentially receiving each of said set of inputs;
        a third input; and
        an output for outputting a product of values received at said first input, said second input and said third input;
    a three input adder comprising:
        a first input coupled to said output of said three input multiplier;
        a second input coupled to said second input of the lambda rule engine, for sequentially receiving each of said set of inputs;
        a third input; and
        an output for outputting a function value;
    a shift register comprising:
        an input coupled to said output said three input adder; and
        an output coupled to said third input of said three input multiplier and coupled to said third input of said three input adder.

2. The recursive lambda rule engine according to claim 1 wherein said three input adder comprises:
    a first two input adder comprising:
        said first input of said three input adder;
        said second input of said three input adder; and
        an output; and
    a second two input adder comprising:
        a first input coupled to said output of said first two input adder;
        said third input of said three input adder; and
        said output of said three input adder.

3. The recursive lambda rule engine according to claim 1 wherein said three input adder comprises:

a first two input adder comprising:
            said first input of said three input adder;
            said third input of said three input adder; and
            an output; and
         a second two input adder comprising:
            a first input coupled to said output of said first two input adder;
            said second input of said three input adder; and
            said output of said three input adder.
   4. The recursive lambda rule engine according to claim 1 wherein said three input multiplier comprises a first two input multiplier coupled to a second two input multiplier.
   5. The recursive lambda rule engine according to claim 1 wherein
      said lambda rule engine further comprises:
         a multiplexer coupled between said output of said three input adder and said input of said shift register, said multiplexer comprising:
            a first input coupled to said output of said three input adder;
            a second input for receiving an initial function value; and
            an output coupled to said input of said shift register.
   6. A digital signal filter comprising said recursive lambda rule engine according to claim 1 and further comprising:
      a signal sample register for storing a series of signal samples;
      a filter parameter memory for storing a set of filter parameters in an unsorted state;
      a sorter coupled to said signal sample register and said filter parameter memory, wherein said sorter is adapted to determine a monotonic ordering of said series of signal samples and to supply said set of filter parameters as said set of inputs to said recursive lambda rule engine in an order that is determined by a permutation of said series of signal samples required to achieve said monotonic ordering;
      a Q-measure computer coupled to said recursive lambda rule engine, wherein said Q-measure computer is adapted to compute a set of normalized function values by dividing each value of said function output by said recursive lambda rule engine by a largest value of said function;
      a Q-measure difference computer coupled to said Q-measure computer, wherein said Q-measure difference computer is adapted to compute differences between successive pairs of said normalized function values;
      a MAC coupled to said Q-measure difference computer and to said sorter, wherein said MAC is adapted to compute a dot product between said differences and said series of samples, wherein said series of signal samples are used in an order determined by said monotonic ordering.
   7. A nonlinear distance metric computer comprising said recursive lambda rule engine according to claim 1 and further comprising:
      a subtractor comprising a first input for receiving a first vector, a second input for receiving a second vector and an output, wherein said subtractor is adapted to compute a vector difference between said first vector and said second vector and wherein said vector difference comprises a set of component differences;
      a magnitude computer comprising an input coupled to said output of said subtractor for receiving said set of component differences, and a magnitude computer output, wherein said magnitude computer is adapted to compute absolute values of said component differences, and wherein said magnitude computer is coupled to said recursive lambda rule engine.
   8. The nonlinear distance metric computer according to claim 7 further comprising:
      a second multiplier coupled between said magnitude computer output and said recursive lambda rule engine, wherein said second multiplier comprises:
         a first input for receiving said absolute values of said component differences;
         a second input for receiving dimension weights; and
         a multiplier output coupled to said recursive lambda rule engine.
   9. An aggregator comprising a first recursive lambda rule engine according to claim 1 and a second recursive lambda rule engine according to claim 1 and further comprising:
      a first input for receiving a plurality of values to be aggregated;
      a second input for receiving a plurality of weights, wherein said second input of the aggregator is coupled to said second input of said first recursive lambda rule engine that is used for receiving said set of inputs;
      a second multiplier comprising:
         a first input coupled to said first input of the aggregator;
         a second input coupled to said second input of the aggregator; and
         an output coupled to said second input of said second recursive lambda rule engine that is used for receiving said set of inputs; and
      a divider comprising:
         a denominator input coupled to said output of said three input adder of said first recursive lambda rule engine; and
         a numerator input coupled to said output of said three input adder of said second recursive lambda rule engine.

* * * * *

UNITED STATES PATENT AND TRADEMARK OFFICE
CERTIFICATE OF CORRECTION

| | |
|---|---|
| PATENT NO. | : 7,904,497 B2 |
| APPLICATION NO. | : 11/554704 |
| DATED | : March 8, 2011 |
| INVENTOR(S) | : Nasir et al. |

Page 1 of 1

It is certified that error appears in the above-identified patent and that said Letters Patent is hereby corrected as shown below:

On the Title Page, in the Figure, for Tag "112", delete "$F_{(2)}$" and insert -- $F_{(2)}$, --, therefor.

In Fig. 2, Sheet 2 of 5, for Tag "112", delete "$F_{(2)}$" and insert -- $F_{(2)}$, --, therefor.

In Fig. 3, Sheet 3 of 5, for Tag "202", Line 2, delete "$F_{(2)}$" and insert -- $F_{(2)}$, --, therefor.

In Column 3, Line 21, delete "$f_i$." and insert -- $f_i$. --, therefor.

In Column 3, Line 50, delete "fi" and insert -- $f_i$ --, therefor.

In Column 4, Line 55, delete "(fi)" and insert -- ($f_i$) --, therefor.

In Column 5, Line 67, delete "x" and insert -- x; --, therefor.

Signed and Sealed this
First Day of January, 2013

David J. Kappos
*Director of the United States Patent and Trademark Office*